(12) United States Patent
Lanzillo et al.

(10) Patent No.: US 11,756,887 B2
(45) Date of Patent: Sep. 12, 2023

(54) BACKSIDE FLOATING METAL FOR INCREASED CAPACITANCE

(71) Applicant: International Business Machines Corporation, Armonk, NY (US)

(72) Inventors: Nicholas Anthony Lanzillo, Wynantskill, NY (US); Hosadurga Shobha, Niskayuna, NY (US); Huai Huang, Clifton Park, NY (US); Lawrence A. Clevenger, Saratoga Springs, NY (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 17/354,428

(22) Filed: Jun. 22, 2021

(65) Prior Publication Data

US 2022/0406717 A1    Dec. 22, 2022

(51) Int. Cl.
  *H01L 23/528*    (2006.01)
  *H01L 21/768*    (2006.01)
  *H01L 23/522*    (2006.01)
  *H01L 23/532*    (2006.01)

(52) U.S. Cl.
  CPC ...... *H01L 23/5286* (2013.01); *H01L 21/7684* (2013.01); *H01L 23/5223* (2013.01); *H01L 23/5226* (2013.01); *H01L 23/5283* (2013.01); *H01L 23/53209* (2013.01)

(58) Field of Classification Search
  CPC ............ H01L 23/5286; H01L 23/5223; H01L 23/5226; H01L 23/5283; H01L 23/53209; H01L 21/7684

USPC ........................................................ 257/734
See application file for complete search history.

(56) References Cited

U.S. PATENT DOCUMENTS

| 6,355,950 B1 | 3/2002 | Livengood |
| 6,495,454 B2 | 12/2002 | Livengood |
| 6,667,518 B2 | 12/2003 | Christensen |
| 8,552,563 B2 | 10/2013 | Law |
| 9,331,062 B1 | 5/2016 | Lane |

(Continued)

FOREIGN PATENT DOCUMENTS

WO    2018063376 A1    4/2018

OTHER PUBLICATIONS

"Patent Cooperation Treaty PCT Notification of Transmittal of the International Search Report and the Written Opinion of the International Searching Authority, or the Declaration", International application No. PCT/EP2022/066652, International filing date Jun. 20, 2022 (Jun. 20, 2022), dated Oct. 24, 2022 (dated Oct. 24, 2022), 17 pages.

(Continued)

*Primary Examiner* — Tu-Tu V Ho
(74) *Attorney, Agent, or Firm* — Edward J. Wixted, III

(57) ABSTRACT

A semiconductor structure with one or more backside metal layers that include a plurality of portions of a floating metal layer separated by dielectric material from one or more power and ground lines in the backside metal layer. The height of each of the plurality of portions of the floating metal layer in each of the one or more backside metal layers and the distance between adjacent portions of the plurality of portions of the floating metal layer in each of the one or more backside metal layer correlates to the capacitance of each of the one or more backside metal layers.

22 Claims, 8 Drawing Sheets

(56) References Cited

U.S. PATENT DOCUMENTS

| | | |
|---|---|---|
| 9,455,214 B2 | 9/2016 | Maling |
| 9,502,350 B1 | 11/2016 | Bonilla |
| 10,256,186 B2 | 4/2019 | Bonilla |
| 10,636,739 B2 | 4/2020 | Beyne |
| 10,685,168 B2 | 6/2020 | Widiger |
| 10,878,162 B2 | 12/2020 | Peng |
| 2002/0020862 A1 | 2/2002 | Livengood |
| 2021/0028112 A1 | 1/2021 | Kim |
| 2022/0093492 A1* | 3/2022 | Elsherbini ............... H01L 23/49 |
| 2022/0208682 A1 | 6/2022 | Son |

OTHER PUBLICATIONS

Disclosed Anonymously, et al., "Maximizing Decoupling Capacitance Utilizing Fill", ip.com Prior Art Database Technical Disclosure, IPCOM000216024D, Mar. 19, 2012, 9 pgs., <https://ip.com/IPCOM/000216024>.

Disclosed Anonymously, et al., "Metal Density Aware Signal Routing Method", ip.com Prior Art Database Technical Disclosure, IPCOM000184127D, Jun. 12, 2009, 7 pgs., <https://ip.com/IPCOM/000184127>.

Kahng, et al., "Study of Floating Fill Impacton Interconnect Capacitance", Proceedings of the 7th International Symposium on Quality Electronic Design, Mar. 2006, 6 pgs., <https://doi.org/10.1109/ISQED.2006.126>.

* cited by examiner

BACKSIDE FLOATING METAL FOR INCREASED CAPACITANCE

BACKGROUND OF THE INVENTION

The present invention relates generally to the field of semiconductor device manufacture and more particularly to the formation of backside floating metal for increased capacitance in backside power distribution.

According to Moore's Law, the number of transistors in a semiconductor chip approximately doubles every two years, driving smaller and smaller transistors and smaller connections between the transistors. One of the drivers for semiconductor chip complexity and computing system functionality is the increasing use of artificial intelligence with deep neural networks that require more device circuits and faster processing speeds. Semiconductor chip designs are continually packaging more circuits into semiconductor chips and as a result, the line widths and the space between adjacent device elements within the semiconductor chip continues to shrink to support the increasing computer system functionality requirements. As the transistors and the interconnect wires become smaller, the transistors and interconnect wiring in the semiconductor chips are more resistive and use more power.

Additionally, advances in semiconductor chip process technology and digital system architecture have led to integrated circuits having increased operating frequencies. Higher operating frequencies typically result in undesirable increases in power consumption in the semiconductor chips. Typically, power consumption is a significant problem for semiconductor chips, and in particular for large scale, complex, high speed processors and microprocessors. As increasing operating frequencies and increasing number of device circuits with faster processing speeds are needed, the power delivery networks in semiconductor chips need to provide more power without significantly impacting the ability to provide desired electrical performance and the required device circuits with interconnect wiring. The ability to provide more power for the increasing power consumption due to higher operating frequencies and for the additional semiconductor devices in semiconductor chips is becoming increasingly difficult.

Typically, semiconductor devices, such as transistors are formed in front side metal layers in the semiconductor chip and are connected by layers of interconnects and power structures formed in the front side metal layers above the transistors. In traditional semiconductor chip design, the power delivery network is formed by conductors and vias in the front side metal layers and is connected to VDD/VSS terminals of the semiconductor chip to deliver power to the individual devices or transistors in the front side of the semiconductor chip. Conventional power rails in a traditional power delivery network typically reside with the memory devices or in the interconnect layers above the transistors in the core logic areas of the semiconductor chip where the power rails connect to the power and ground terminals of the transistors. Conventional power rails in the front side metal interconnect layers of the semiconductor chip utilize a significant amount of semiconductor wiring area and limit semiconductor wiring.

In some semiconductor chips, buried power rails can be formed within a portion of the semiconductor substrate. Typically, buried power rails are formed in a single metal layer within the semiconductor substrate. Buried power rails are generally limited to a single metal layer. In other emerging semiconductor structures, power planes are formed on the back side of a semiconductor substrate, and a series of deep vias through the semiconductor substrate are used to couple the power planes to front side metal lines in the semiconductor chip. Each of the power planes are continuous over the backside of the semiconductor substrate and cover the backside of the semiconductor substrate. The layers of the backside power planes are separated by a dielectric material. A high k dielectric material can be used for increased capacitance, but the use of backside power planes, where each of the backside power planes encompasses the area of the semiconductor substrate, provides minimal opportunity to tailor the electrical or thermal performance of each backside metal layer of the backside power planes.

SUMMARY

Embodiments of the present invention disclose a semiconductor structure with one or more backside metal layers providing power to one or more front side metal layers of the semiconductor structure. Embodiments of the present invention provide one or more of the backside metal layers that include a plurality of portions of a floating metal layer separated by a dielectric material from one or more power and ground lines. Embodiments of the present invention provide the portions of the floating metal layer between the power and ground lines where the portions of the floating metal layer are not directly connected to backside ground lines. Even without explicit ground connections, the portions of the floating metal layer provide increased capacitance for backside metal layers in the semiconductor structure.

Embodiments of the present invention create semiconductor structures with backside metal layers on the semiconductor substrate that form the power distribution network. By moving the power distribution network from front side of semiconductor substrate to the backside of the semiconductor substrate, embodiments of the present invention provide additional area in the front side metal layers in the semiconductor chip for more front side interconnect wiring and/or more semiconductor devices. Alternatively, embodiments of the present invention that move the power distribution network or portions of the power distribution network from the front side of the semiconductor chip to the backside of the semiconductor chip provide an ability to reduce the semiconductor chip size. Embodiments of the present invention moving the power distribution network or portions of the power distribution network from the front side of the semiconductor chip to the backside of the semiconductor chip can combine the ability to reduce the semiconductor chip size and to increase available area in the front side metal layers for additional semiconductor devices or interconnect wiring.

Embodiments of the present invention disclose the semiconductor structure where the height of each of the plurality of portions of the floating metal layer in each of the backside metal layers with a floating metal layer and the distance between adjacent portions of the floating metal layer in each backside metal layer with a floating metal correlates with the capacitance of each of the backside metal layers with the portions of the floating metal layer. Embodiments of the present invention provide an ability to control, at least in part, the amount of capacitance and the amount of the thermal conductivity provided by a backside metal layer by controlling the amount of metal or the density of the portions of the floating metal layer.

Embodiments of the present invention disclose semiconductor structures where the portions of the floating metal layer contact the semiconductor wafer. Embodiments of the present invention also provide semiconductor structures where the power and ground lines contact the semiconductor wafer and the portions of the floating metal layer reside on the dielectric material separating the power and ground lines from the portions of the floating metal. In each semiconductor structure, embodiments of the present invention have an ability to provide a desired capacitance and a desired thermal capability for each backside metal layer. Embodiments of the present invention provide the ability to determine, at least in part, the capacitance and thermal capability of each backside metal layer by controlling one or more of the height of the portions of the floating metal layer, the dielectric constant of the dielectric material, and the pitch of the power and ground lines.

Embodiments of the present invention disclose a method of forming the plurality of portions of the floating metal layer in one or more backside metal layers of a semiconductor wafer where the method utilizes a damascene backside metallization process that includes selectively etching portions of the backside of the semiconductor wafer and depositing a dielectric material over the backside of the semiconductor wafer. The method includes depositing a first metal layer over the dielectric material and removing the excess portions of the first metal layer over the dielectric material with a first chemical mechanical polish. Additionally, the method includes depositing the second metal layer over exposed surfaces of the backside of the semiconductor wafer, the dielectric material, and the first metal layer. The method includes removing excess portions of the second metal layer over a top surface of the first metal layer with a second chemical mechanical polish and depositing an interlevel dielectric material over exposed surfaces of the second metal layer, the dielectric material, and the first metal layer. Using this method, controlling the depth of the etch process of the semiconductor wafer and the space between removed portions of the semiconductor wafer, controls, at least in part, a capacitance providing by the remaining portions of the second metal layer forming the floating metal layer. Embodiments of the presentation invention include an optional step of recessing the second metal layer before depositing the interlevel dielectric material. Embodiments of the present invention utilizing the optional step to recess the second metal provide a method to further adjust the amount of the capacitance provided to the backside power lines by the portions of the floating metal layer formed by the remaining portions of the second metal layer.

Embodiments of the present invention also disclose a method of forming a plurality of portions of a floating metal layer in one or more backside metal layers of a semiconductor wafer using a subtractive metallization process. This method includes depositing the first metal layer on the backside of a semiconductor wafer and selectively etching the first metal layer to form one or more of a plurality of power and ground lines on the backside of the semiconductor wafer. The method includes depositing a dielectric material over exposed surfaces of the first metal layer and the backside of the thinned semiconductor wafer. The method includes depositing a second metal layer over the dielectric material and, then removing the excess portions of the second metal layer over the dielectric material. Furthermore, the method includes depositing a layer of an interlevel dielectric material over the exposed surfaces of the dielectric material and the second metal layer. The method includes an optional step to recess the remaining portions of the second metal layer before depositing the interlevel dielectric material adjust the amount of capacitance and thermal capability provided by the remaining portions of the second metal that form the floating metal layer.

BRIEF DESCRIPTION OF THE DRAWINGS

The above and other aspects, features, and advantages of various embodiments of the present invention will be more apparent from the following description taken in conjunction with the accompanying drawings.

DETAILED DESCRIPTION

Figure 1:
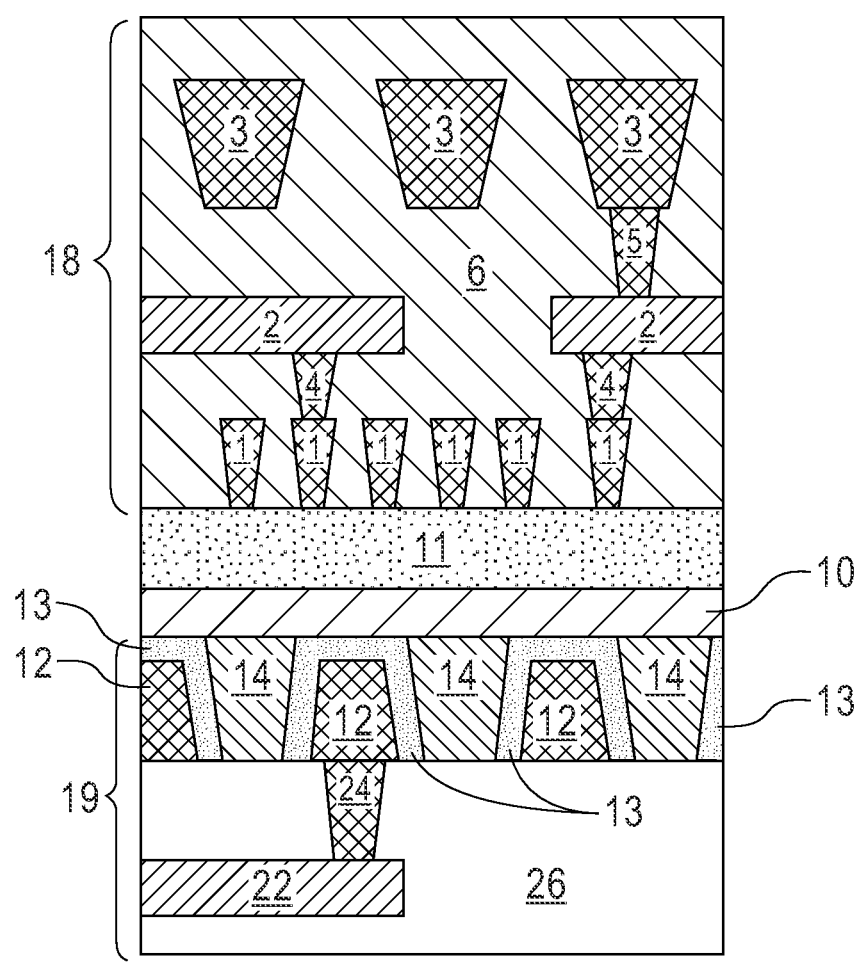
FIG. 1 depicts a cross-sectional view of a semiconductor structure with a backside power delivery structure and a backside floating metal for increased capacitance in accordance with an embodiment of the present invention.

Embodiments of the present invention recognize buried power rails generally provide a single metal layer for power distribution in the semiconductor substrate or wafer. Embodiments of the present invention recognize buried power rails in the semiconductor substrate provide a limited amount of metallization for the power delivery network and can provide only a portion of the power required by many semiconductor chips. Embodiments of the present invention recognize that advanced semiconductor device designs are driving more circuits into semiconductor chips. In order provide more circuits and devices in semiconductor chips, feature sizes such as line widths and space between device elements are shrinking. As the devices and the interconnect lines become smaller, the devices and interconnect lines in the semiconductor chips become more resistive and can use more power. Additionally, embodiments of the present invention recognize that advances in semiconductor process technology and digital system architecture have led to integrated circuits having increased operating frequencies requiring more power. Embodiments of the present invention recognize that semiconductor structures capable of providing more power to the semiconductor chip without impacting electrical performance would be desirable.

Embodiments of the present invention recognize that moving the power delivery network to the backside of the wafer utilizing through silicon vias (TSVs) to connect to front side metal layers reduces wiring demand on front side wiring layers. Using multiple backside metal layers for the backside power delivery network provides more power and ground lines and more power planes than conventional buried power rails to distribute power. Embodiments of the present invention recognize the new semiconductor structures providing a backside power delivery network in multiple backside metal layers would be desirable. Embodiments of the present invention recognize that an ability to create a backside power distribution network can provide smaller semiconductor chips.

Embodiments of the present invention recognize that providing power to front side semiconductor devices from the backside of the semiconductor chip requires decoupling capacitance on the backside of the semiconductor chip to stabilize the current flow on the backside of the semiconductor chip. Embodiments of the present invention recognize an ability to provide increased capacitance to stabilize current flow to backside power lines is desirable. Furthermore, embodiments of the present invention recognize that decoupling capacitance in the backside metal layers of the power delivery network reduces power supply noise.

Embodiments of the present invention provide semiconductor structures and methods of forming semiconductor structures that form portions of a floating metal layer that are between power and ground lines for a power delivery network in one or more backside metal layers of the semiconductor chip. Embodiments of the present invention provide a plurality of backside metal layers with the floating metal between the power and ground lines to increase the decoupling capacitance and the capacitance density for backside power delivery. Embodiments of the present invention provide a semiconductor structure with portions of a backside floating metal in one or more backside metal layers to increase decoupling capacitance for current stability of the backside power delivery network that provides power to semiconductor devices on the front side of the wafer. While the floating metal does not contact the power and ground lines on the backside of the wafer, embodiments of the present invention provide the portions of the floating metal layer that increases capacitance even without explicit ground connections.

Embodiments of the present provide any number of backside metal layers where each backside metal layer is composed of one or more of power planes, one or more portions of power planes, or a plurality of portions of a floating metal layers separated by a dielectric material from a number of power and ground lines to form a backside power distribution network. Creating the power distribution network in the backside metal layers of the semiconductor chip frees up front side metal layers in the semiconductor chip for additional wiring and circuits and/or can shrink the size of the semiconductor chip.

Embodiments of the present invention provide portions of the portions of the floating metal layer between and separated from the power and ground lines by a high k dielectric material to increase the capacitance density of the backside power delivery network. Embodiments of the present invention provide an ability to use high k dielectric constant materials on the backside of the wafer to increase the backside decoupling capacitance while still using low-k dielectric constant materials in front side metal layers for reduced parasitic capacitance between signal lines on the front side of the wafer.

Embodiments of the present invention provide power distribution networks using portions of a floating metal layer and a number of power and ground lines in one or more semiconductor chip backside metal layers. The portions of the floating metal layer and the power and ground lines are formed in previously empty or unused portions of the backside of the wafer. Embodiments of the present invention provide the portions of the floating metal layer with the same height as the adjacent power and ground lines. Other embodiments of the present invention provide the floating metal with a different height than the height of the adjacent power and ground lines. Embodiments of the present invention adjust a height of the portions of the floating metal layer to provide a desired capacitance. Additionally, embodiments of the present invention can control the amount of the floating metal to achieve a desired thermal capability of each backside metal layer with the floating metal.

Embodiments of the present invention provide a way to control, at least in part, a capacitance of the backside power structure using the density of the floating metal where the density of the floating metal is determined by the height of the floating metal adjacent to the power and ground lines and the distance between adjacent portions of the floating metal layer. Embodiments of the present invention can adjust the distance between the adjacent portions of the floating metal layer by changing the pitch of adjacent power and/or ground lines. The density of the portions of the floating metal layer affects the capacitance density of the backside metal power delivery network. Embodiments of the present invention provide an ability to control or adjust the capacitance density of each backside metal layer of the backside power delivery network by controlling the height of the portions of the floating metal layer and the pitch or distance between the portions of the floating metal layer.

Embodiments of the present invention adjust, at least in part, the capacitance of the backside metal layers with the selection of the dielectric material between the portions of the floating metal and the power and ground lines. The dielectric constant of the dielectric material between the portions of the floating metal and the power and/or ground lines determines, at least in part, the capacitance or decoupling capacitance provided by the floating metal adjoining the dielectric material that abuts the power and ground lines in the backside metal layers. Embodiments of the present invention provide a dielectric material with a high k dielectric constant to separate the portions of the floating metal from the power and ground lines. Using a dielectric material with a high k dielectric constant between the floating metal and the power and ground lines further increases the capacitance provided by embodiments of the present invention.

Embodiments of the present invention provide a method and a structure to control, at least in part, the amount of capacitance, the power distributed, and the thermal conductivity of the backside metal layers by the number of backside metal layers utilizing the floating metal. Additionally, embodiments of the present invention can increase the backside metal density to improve the dissipation of thermal energy created by front side semiconductor devices forming hotspots in the semiconductor chip.

Embodiments of the present invention provide a plurality of backside metal layers incorporating power and ground lines that are separated from the floating metal by a portion of a layer of a high k dielectric material. While descriptions of embodiments of the present invention focus on forming the floating metal in the first backside metal layer on a wafer substrate with previously formed front side devices and wiring, as known to one skilled in the art, with minor process variations, the floating metal can be formed in more than one backside metal layers on the wafer along with one or more power planes or portions of a power plane in other backside metal layers. With embodiments of the present invention, the portions of the floating metal layer can be formed in a third or fourth metal layer on the backside of the wafer.

Embodiments of the present invention provide several methods of forming the semiconductor structures with floating metal separated from the power and ground lines by a dielectric material that is also between the power and ground lines. Embodiments of the present invention provide both subtractive and damascene metallization processes to form the floating metal.

Embodiments of the present invention provide a subtractive metallization process to form the floating metal that includes depositing a metal layer on the top surface of a flipped wafer. The flipped wafer is a thinned wafer and the top surface of the flipped wafer is the bottom surface of the backside of the wafer after device formation and backside grind of the wafer.

Embodiments of the present invention provide the metal material is a metal that is compatible with semiconductor subtractive etch processes such as reactive ion etch. The metal layer is patterned and selectively etched to form power and ground lines in the first backside metal layer. A dielectric material is deposited over the power and ground lines and the exposed surfaces of the backside of the wafer. The dielectric material selection of can improve the capacitance.

A second metal layer is deposited over the dielectric material. A second metal layer is deposited over the dielectric material. The second metal layer can be the same metal or a different metal than the metal in the first metal layer. In various embodiments, the metal of the second metal layer is capable of being etched with subtractive etch processes. A chemical mechanical polish (CMP) removes the excess portions of the second metal layer above the top portion of the high k dielectric material.

Embodiments of the present invention provide an optional metal layer recessing step. In the optional recessing step, the second metal layer is recessed using a subtractive etch process. The amount of recessing of the second metal layer controls the amount of floating metal between the power and ground lines. The recessing of the second metal material provides one method of controlling, at least in part, the capacitance provided by the floating metal and the metal density of the floating metal affecting the thermal capacity of the floating metal in the backside metal layer.

After depositing the second metal layer or after performing the optional recessing of the second metal layer, a layer of an interlevel dielectric material is deposited over the semiconductor structure. The interlevel dielectric material covers the exposed portions of the dielectric material and the floating metal. After forming the floating metal, the power and ground lines, and depositing the interlevel dielectric, another backside metal layer can be deposited on the interlevel dielectric material and another backside power structure, such as a portion of a power plane or another floating metal layer with power and ground lines can be formed. One or more vias may be formed in the interlevel dielectric material connecting the power and ground lines in the first backside metal layer to one or more metal layers on the front side of the semiconductor wafer. Embodiments of the present invention provide a method of forming the portions of floating metal layer in a second, third, fourth, fifth, or higher backside metal layer using the subtractive metallization processes. The portions of the floating metal layer and the power and ground lines formed in the second and higher metal layers may require larger sizes and spaces similar to semiconductor lines and features already formed in higher metal layers of the back-end of the line (BEOL) interconnect layers on the top side of the semiconductor wafer. In various embodiments, through silicon vias connecting backside metal layers to front side metal layer are formed before forming the backside metal layers.

Embodiments of the present invention provide a damascene metallization process to form the power delivery network in one or more backside metal layers on a wafer substrate. The damascene metallization process for backside metal layers includes patterning and etching the top surface of the backside of the wafer where the backside of the flipped wafer is presented as the top surface for the patterning and etching processes. The etch of the wafer creates recesses or trenches in the backside of the wafer. The pitch of the trenches is determined by the patterning prior to etching and the depth of the trenches is determined by the etch process (e.g., controlled by the etch process parameters such as dosage and etch time). The pitch and depth of the trenches correlate to the capacitance and the thermal characteristics of each backside metal layer. The method includes depositing a layer of a dielectric material, such as a high k dielectric material over the semiconductor structure covering exposed surfaces of the backside of the wafer. A layer of the first metal is deposited over the dielectric material and a CMP removes the excess portions of the first metal above the top surface of the dielectric material. After the CMP, the first metal remains in the formed trenches surrounded by the dielectric material. Embodiments of the present invention create the power and ground lines in the completed semiconductor chip from the first metal above the top surface of the dielectric material.

Embodiments of the present invention provide a next step in the method using the damascene metallization process to form the floating metal. The next step includes using a wet process combined with a dry etch process to remove the wafer material surrounding the sides of the dielectric material. After completing the combined wet and dry etch process, at least a bottom portion of the dielectric material contacts the wafer. Portions of the first metal remain inside the dielectric material.

Embodiments of the present invention include depositing a second metal over the top of the semiconductor structure. The second metal covers exposed portions of the wafer, the dielectric material, and the first metal. A CMP removes the excess second metal above the top portion of the dielectric material. In some embodiments, the dielectric material is a CMP stop. In one embodiment, a portion of the dielectric material and the first metal is removed. The remaining portions of the second metal on portions of the wafer and surrounded by the sides of the dielectric material form the floating metal in the completed semiconductor chip.

Embodiments of the present invention include an optional step to recess the second metal. The amount of the second metal removed is controlled. The amount of the second metal removed controls the height of the floating metal remaining. By controlling the height of the floating metal during the recessing etch processes, the capacitance provided by the floating metal can be adjusted or controlled. As discussed above with respect to the subtractive metallization process, the amount of the second metal remaining after the optional recessing of the second metal determines the density of the floating metal for removing thermal energy and providing capacitance.

Embodiments of the present invention provide methods of forming portions of a floating metal layer in one or more backside metal layers on a backside of a wafer using either damascene metallization processes or subtractive metallization processes. The methods can control the size, the shape, and the distance between the portions of the floating metal layer surrounded, at least in part, by the dielectric material as a way of controlling the capacitance in the backside power delivery network. By providing a backside power delivery network with the portions of the floating metal layer also provides additional wiring capability in the front side metal layers of the semiconductor chip (e.g., frees up semiconductor real estate in the topside wafer metal layers for wiring previously required for the power delivery network).

Detailed embodiments of the claimed structures and methods are disclosed herein. The method steps described below do not form a complete process flow for manufacturing integrated circuits, such as, semiconductor devices. The present embodiments can be practiced in conjunction with the integrated circuit fabrication techniques currently used in the art, for magnetic tape heads, and only so much of the commonly practiced process steps are included as are necessary for an understanding of the described embodiments. The figures represent cross-section portions of a semiconductor structure after fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

In the interest of not obscuring the presentation of the embodiments of the present invention, in the following detailed description, some of the processing steps, materials, or operations that are known in the art may have been combined together for presentation and for illustration purposes and in some instances may not have been described in detail. Additionally, for brevity and maintaining a focus on distinctive features of elements of the present invention, description of previously discussed materials, processes, and structures may not be repeated with regard to subsequent Figures. In other instances, some processing steps or operations that are known may not be described. It should be understood that the following description is rather focused on the distinctive features or elements of the various embodiments of the present invention.

FIG. 1 depicts a cross-sectional view of semiconductor structure 100 with backside wafer structures 19 for a backside power delivery structure composed power and ground lines 12 and floating metal 14 for increased capacitance in accordance with an embodiment of the present invention. As depicted, FIG. 1 includes signals 1 in the M1 metal layer, signals 2 in the M2 metal layer, signals 3 in the M3 metal layer, vias 4 connecting some of signals 1 to signals 2, via 5 connecting one of signal 2 to one of signal 3 where each of signals 1, 2, and 3 along vias 4 and 5 depict a portion of BEOL interconnect layers 18 in ILD 6 above device region 11 on wafer substrate 10. FIG. 1 also depicts backside wafer structures 19 with two backside metal layers including the first metal layer on the backside of wafer substrate 10 that is composed of floating metal 14, separated from power and ground lines 12 by dielectric material 13 and the second metal layer on the backside of wafer substrate 10 with power plane 22 in ILD 26. As depicted, power plane 22 in the second backside metal layer connects by via 24 to power and ground lines 12 in the first backside metal layer. In other examples, power plane 22 can be a portion of a power plane or another layer of power and ground lines (e.g., power and ground lines 12 in the second backside metal layer). Semiconductor structure 100 can be formed using a damascene metallization process as discussed later in detail with respect to FIGS. 9-17.

Power and ground lines 12, floating metal 14, and power plane 22 on the backside of wafer substrate 10 can be composed of, but are not limited to copper, ruthenium, cobalt, tungsten, or other metal or metal alloy material suitable for use in semiconductor conductors. Power and ground lines 12 can be alternating adjacent power and ground lines but, are not limited to this arrangement. In some examples, adjacent power and ground lines 12 can be two adjacent power lines surrounded by ground lines. In some cases, power and ground lines 12 may be power rails. The specific assignments of power lines and ground lines can be determined by the semiconductor chip design. A spacing or pitch between power and ground lines 12 can determine the length of each floating metal 14. The spacing between the power and ground lines 12 and a height of floating metal 14 correlates to a capacitance of the first backside metal layer on wafer substrate 10. The methods of forming semiconductor substructure 100 provide an ability to adjust or change the height of floating metal 14 and the pitch between power and ground lines 12 to achieve a desired electrical performance in the completed semiconductor chip. Changing either or both of the height of floating metal 14 or the pitch of power and ground lines 12 can increase or decrease both the capacitance and thermal capacity of each backside metal layer. Additionally, floating metal 14 while not connected to power or ground lines 12 increases the capacitance of each backside metal layer using a floating metal layer such as floating metal 14 depicted in the first backside metal layer on wafer substrate 10.

While FIG. 1 depicts only two backside metal layers, the embodiments of the present are not limited to two backside metal layers. In other embodiments, five or six backside metal layers may be present where each of the five or six metal layers are separated by an ILD material and connected by one or more vias (e.g., similar to via 24). One or more of the multiple backside metal layers can include a number of portions of floating metal that are similar to floating metal 14 that are separated by dielectric material 13 from power and ground lines (e.g., similar to power and ground lines 12). For example, power and ground lines that are similar to power and ground lines 12 can be formed in a third backside metal layer (not depicted in FIG. 1) along with a number of portions of the floating metal layer. Dielectric material 13 or another similar high k dielectric material can separate the floating metal from the power and ground lines in the third backside metal layer.

The power and ground lines in the third backside metal layer can be formed with the same or similar processes but may have a larger size and/or pitch between the third metal layer power and ground lines than power and ground lines 12 in the first backside metal layer. As known to one skilled in the art, due to semiconductor manufacture process limitations, the size of power and ground lines 12 and floating metal 14 and the space between them can increase in subsequent backside metal layers (e.g., power and ground lines 12 can be larger with more space between them in a fifth backside metal layer).

As depicted in FIG. 1, floating metal 14 is formed between power and ground lines 12 in a first backside metal layer. In FIG. 1, floating metal 14 is separated from power and ground lines 12 by dielectric material 13. In various embodiments, using a high k dielectric material for dielectric material 13 between floating metal 14 power and ground lines 12 increases the capacitance of the power delivery network. By forming floating metal 14 between power and ground lines 12 in a backside metal layer on wafer substrate 10, previously unused portions of the backside of wafer substrate 10 are used.

Also, depicted in FIG. 1 are wafer substrate 10 and device region 11. Wafer substrate 10 can be thinned using known backside wafer grind processes after BEOL processes. Wafer substrate 10 can be a thinned wafer or a portion of a thinned wafer that is thinned using known backside wafer grind processes. Device region 11 can be formed before BEOL processes and includes one or more active semiconductor devices and associated semiconductor structures. Both device region 11 and BEOL interconnect layers 18 are form prior to forming floating metal 14 on the backside of wafer substrate 10.

As depicted in FIG. 1, floating metal 14 and power and ground lines 12 are formed using damascene backside metallization processes. Using a damascene backside metallization process results in power and ground lines 12 with a smaller bottom contact area with wafer substrate 10 and a larger bottom surface of power and ground lines 12 (e.g., the bottom surface of power and ground lines 12 is away from the surface of wafer substrate 10). For example, power and ground lines 12 can form a trapezoidal shape with the smaller portion of the trapezoid contacting wafer substrate 10. In other examples, power and ground lines 12 form rounded cone-shape with a larger bottom surface. As depicted in FIG. 1, the bottom surfaces of power and ground lines 12 and floating metal 14 on the backside of wafer substrate 10 are level. Power and ground lines 12 and floating metal 14 form a first backside metal layer on wafer substrate 10.

BEOL interconnect layers 18 include the wiring, vias, and contacts (not depicted) above device region 11. BEOL interconnect layers 18 includes the signal lines and vias to carry electrical current but, do not include power and ground structures, such as power lines or power planes to distribute power typically required in BEOL interconnect layers 18. In various embodiments, the structures, such as power planes, ground, and power lines reside in the backside metal layers 18 along with floating metal 14. In this way, semiconductor real estate in BEOL interconnect layers 18 is not used for power and ground structures. In embodiments of the present invention, BEOL interconnect layers 18 provide more available semiconductor area in each metal layer for wiring. Even the use of buried power rails cannot provide as much available semiconductor real estate in BEOL interconnect layers 18 for wiring as embodiments of the present invention where multiple backside metal layers are utilized for power and ground structures with improved or increased capacitance due to the presence of floating metal between the backside power and ground lines. While not depicted in FIG. 1, in various embodiments, known through silicon vias (TSVs) connect the backside power structures, such as power and ground lines 12 and/or power plane 22 with any of a buried power rail or one or more of BEOL interconnect layers 18 such as the front side power network.

Figure 16:
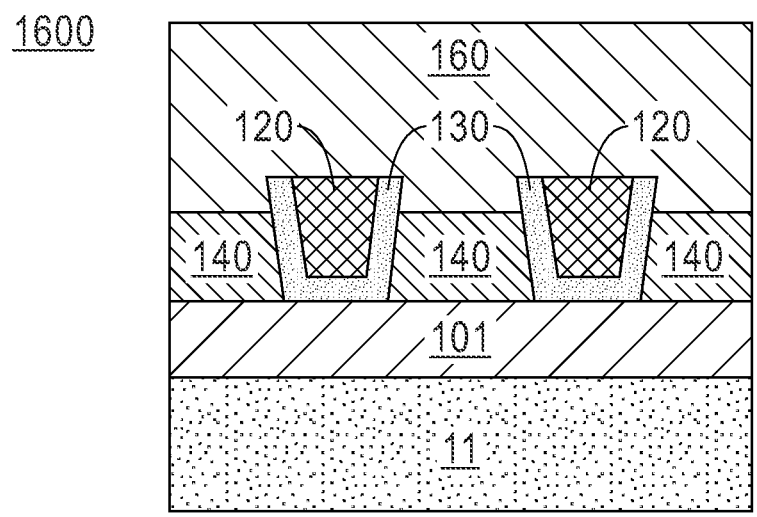
FIG. 16 depicts a cross-sectional view of the semiconductor structure after depositing a layer of ILD material in accordance with an embodiment of the present invention.

FIG. 1 is an extension of FIG. 16 that includes a second backside metal layer forming power plane 22. In various embodiments, the second backside metal layer is connected by one or more of vias 24 to one of power and ground lines 12 residing in the first backside metal layer. FIG. 16 depicts a first backside metal layer with metal 140 forming portions of the floating metal (e.g., floating metal 14 depicted in FIG. 1) and metal material 120 forming power and ground lines (e.g., power and ground lines 12 depicted in FIG. 1). Both semiconductor structures 100 in FIG. 1 and semiconductor structure 1600 in FIG. 16 are formed in various embodiments using damascene metallization processes. FIG. 1 is similar to or essentially the same are FIG. 16 except for the depiction of the additional second backside metal layer with power plane 22 and vias 24 in ILD 26 where vias 24 connect power and ground lines 12 to power plane 22 in FIG. 1.

As previously discussed, in other examples, a third backside metal layer can be present below power plane 22 in FIG. 1 can be present below power plane 22 in FIG. 1. The third backside metal layer (not depicted) connects to power plane 22 in the second backside metal layer using one or more additional vias in ILD 26. The third backside metal layer can include portions of a floating metal layer and power and ground lines separated by a dielectric material similar to the first backside metal layer in FIG. 1. As known to one skilled in the art, conventional semiconductor manufacturing processes may be completed on semiconductor structure 100 (e.g., wafer dicing, etc.) to form a semiconductor chip.

Figure 2:
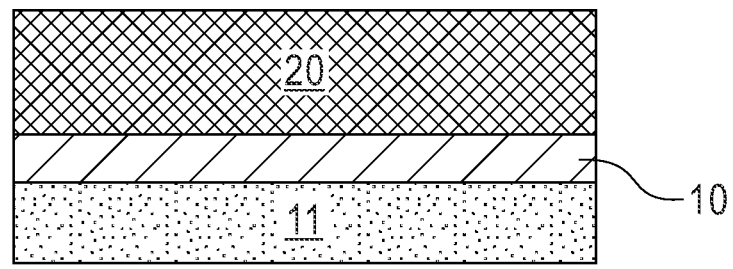
FIG. 2 depicts a cross-sectional view of a semiconductor structure with a portion of a wafer substrate with a metal layer and a device region in accordance with an embodiment of the present invention.

FIG. 2 depicts a cross-sectional view of semiconductor structure 200 with a portion of wafer substrate 10 with metal 20 and device region 11 in accordance with an embodiment of the present invention. FIGS. 2-8 depict embodiments of a subtractive metallization process for forming portions of a floating metal layer in the power delivery network. As depicted, FIG. 2 includes device region 11 and a layer of metal 20 on wafer substrate 10. The layer of metal 20 is on one side of wafer substrate 10 and device region 11 is on the other side of wafer substrate 10. In FIG. 2, wafer substrate 10 is depicted with the front side of wafer substrate 10 down so that device region 11 is under wafer substrate 10. Not depicted in FIG. 2 are the BEOL metal layers, such as M1, M2, M3, etc. in BEOL interconnect layer 18 depicted in FIG. 1.

With respect to FIGS. 2-7 and 9-16, the phrase "top side" or "top surface" can relate to a backside surface of the flipped wafer substrate because the device side of the wafer substrate is facing downward (i.e., device region 11 is on the bottom side of the flipped wafer substrate 10 during the backside of wafer substrate 10 processing). In this way, processing can occur on an exposed surface or an exposed top surface of wafer substrate 10 that is typically called the backside of the wafer substrate to form backside power structures.

Metal 20 is deposited on the backside of wafer substrate 10. In various embodiments, metal 20 is the first backside metal layer that is deposited on the backside of wafer substrate 10. As depicted, in FIG. 2 wafer substrate 10 is flipped such that the front side of wafer substrate 10 with device region 11 is facing downward and the backside of wafer substrate 10 is facing upward.

In various embodiments, a layer of metal 20 is deposited on the exposed surface of wafer substrate 10. Metal 20 can be deposited using known semiconductor deposition methods, such as but not limited to chemical vapor deposition (CVD), plasma vapor deposition (PVD), or atomic layer deposition (ALD). Metal 20 can be any metal material used in semiconductor fabrication that can be subtractively etched to form backside power and ground lines. For example, metal 20 may be composed of cobalt, ruthenium, tungsten, or molybdenum, but is not limited to these metals. A thickness of metal 20, as deposited, may vary depending on the semiconductor chip application and semiconductor devices in device region 11.

For example, the thickness of metal 20 may range from 100 to 200 nm when a cell height of a semiconductor device in device region 11 above metal 20 is around 200 nm. However, other different thicknesses for metal 20 can occur.

In various embodiments, the thickness of metal 20 is dependent, at least in part, on the pitch of the devices in device region 11. While not depicted in FIG. 2, as previously discussed, when another backside metal layer, such as the second backside or the third backside metal layer is deposited, a thickness of each additional layer of backside metal can be thicker and the feature sizes of the formed power and ground lines and associated floating metal between the power and ground lines can be greater.

Figure 3:
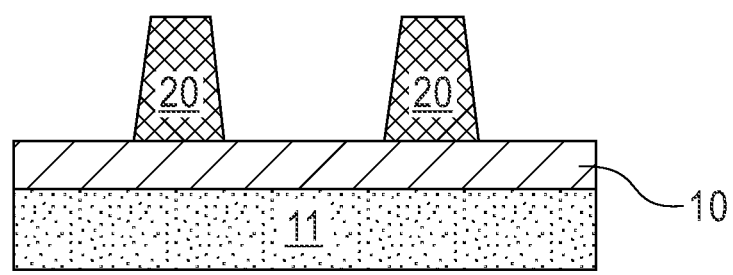
FIG. 3 depicts a cross-sectional view of the semiconductor structure after subtractively etching portions of the metal layer in accordance with an embodiment of the present invention.

FIG. 3 depicts a cross-sectional view of semiconductor structure 300 after subtractively etching portions of metal 20 in accordance with an embodiment of the present invention. As depicted, FIG. 3 includes the elements of FIG. 2 after removing portions of metal 20 to begin forming the power distribution structures (e.g., backside ground and power lines and planes). The remaining portions of metal 20 remaining after the selective etch processes form power and ground lines on the backside of wafer substrate 10. A pitch between the remaining portions of metal 20 determines, at least in part, the length of the portions of a floating metal layer deposited as discussed later with respect to FIG. 5. In some embodiments, a height of the remaining metal 20 determines the height of the portions of the floating metal layer formed with metal 40 as depicted later in FIG. 6.

Conventional photolithography and wafer etch processes may remove portions of metal 20. For example, the top surface of metal 20 may be patterned to remove select portions of metal 20 using a dry etch process, such as reactive ion etch (RIE). The RIE is an anisotropic etch process that can use wafer substrate 10 as an etch stop. As depicted, FIG. 3 includes two portions of metal 20 remaining on wafer substrate 10 after etching. In other examples, any number of portions of metal 20 with the same or different spacing or pitch between the remaining metal 20 can be formed.

A desired height, shape, and the pitch between the remaining portions of metal 20 can vary depending on a number of factors, such as the pitch and height of the device cells above metal 20 in device region 11 or the desired metal density of the power and ground features formed by the remaining portions of metal 20. Different sizes or different shapes of the remaining metal 20 can be created using different patterns in photolithography and with different process parameters during RIE etch. The size, shape, and pitch of the power and ground features formed by the remaining metal 20 after etching can be controlled or tuned for to achieve a specific electrical performance of the completed semiconductor chip. For example, the height and width of the power line can be tuned to minimize resistance, which in turn improves chip performance. Additionally, a space or pitch between adjacent portions of metal 20 affects a capacitance provided by the floating metal created in later processing steps. As depicted in FIG. 3, in various embodiments, after etching, the bottom portion of power and ground lines 12 is larger than the top portion of power and ground lines 12 (e.g., power and ground lines 12 may have a trapezoidal or modified or rounded cone-like cross-section).

Figure 4:
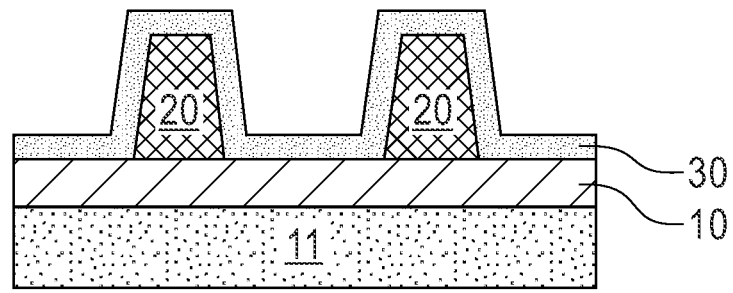
FIG. 4 depicts a cross-sectional view of the semiconductor structure after depositing a dielectric material over the wafer substrate and the remaining portions of the metal layer in accordance with an embodiment of the present invention.

FIG. 4 depicts a cross-sectional view of semiconductor structure 400 after depositing dielectric material 30 is over exposed portions of wafer substrate 10 and the remaining portions of metal 20 in accordance with an embodiment of the present invention. As depicted, FIG. 4 includes device region 11, wafer substrate 10, metal 20, and dielectric material 30. Dielectric material 30 may be any dielectric material. In various embodiments, dielectric material 30 is a high k dielectric material. For example, dielectric material 30 can be, but is not limited to a hafnium oxide material (e.g., $HfO_2$), a zirconium oxide material (e.g., $ZrO_2$), an aluminum nitride material (e.g., AlN), a silicon oxide (e.g., $SiO_2$) or an aluminum oxide material (e.g., $Al_2O_3$).

The thickness of dielectric material 30 can range from 7 nm to 500 nm but, is not limited to this range. Dielectric material 30 may be deposited using one of plasma-enhanced CVD (PECVD), PVD, CVD, or ALD, but may be deposited with other semiconductor manufacture deposition processes. In one embodiment, a spin-on-dielectric material or a spin-on-glass (SOG) is deposited on wafer substrate 10. Dielectric material 30 will separate metal 20 forming the power and ground lines from the floating metal formed in later process steps. The selection of a high k dielectric material for dielectric material 30, such as a hafnium oxide can provide increase capacitance in the completed semiconductor chip (e.g., depicted in FIG. 8).

Figure 5:
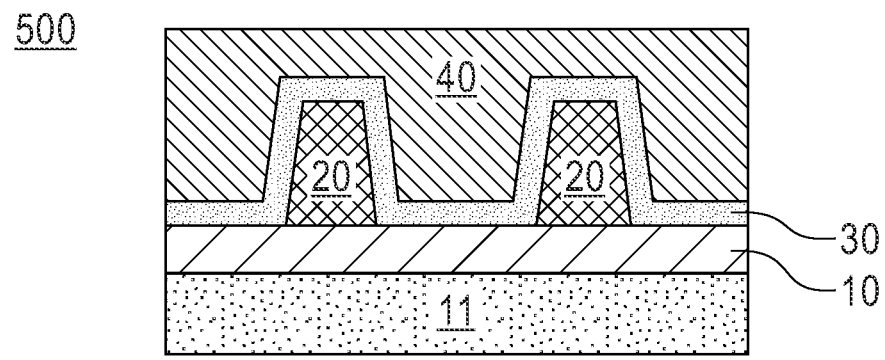
FIG. 5 depicts a cross-sectional view of the semiconductor structure after depositing another metal layer over the dielectric material in accordance with an embodiment of the present invention.

FIG. 5 depicts a cross-sectional view of semiconductor structure 500 after depositing metal 40 over dielectric material 30 in accordance with an embodiment of the present invention. As depicted, FIG. 5 includes the elements of FIG. 4 and metal 40. Metal 40 can be deposited with PVD, CVD, ALD, or any other suitable metal deposition process. Metal 40 can be composed of a different or the same metal material as metal 20. Metal 40 can be composed of, but not limited to, cobalt, ruthenium, molybdenum, or tungsten. As depicted in FIG. 5, the deposition of metal 40 covers dielectric material 30 and can extend above the top surface of dielectric material 30. The combination of metal 20 and metal 40 forms the first backside metal layer in the completed semiconductor chip.

In one embodiment, the deposition of metal 40 covers a bottom portion of dielectric material 30 (e.g., extends up 50% or 70% of the sides of dielectric material 30). When metal 40 is deposited to a desired depth that is below the top surface of dielectric material 30, the CMP discussed with respect to FIG. 6 can be eliminated. In other words, a controlled metal 40 deposition to the desired height could be used instead of metal 40 deposition followed by a CMP and a wet etch recess as discussed later with respect to FIG. 6.

As depicted in FIG. 5, in various embodiments, a bottom portion of metal 40 contacting dielectric material 30 and adjacent to wafer substrate 10 is smaller than the top portion of metal 40 that is not adjacent to wafer substrate 10. For example, metal 40 forming the floating metal can have a trapezoidal shape where the smaller portion of the trapezoid is adjacent to wafer substrate 10 and above dielectric material 30.

Figure 6:
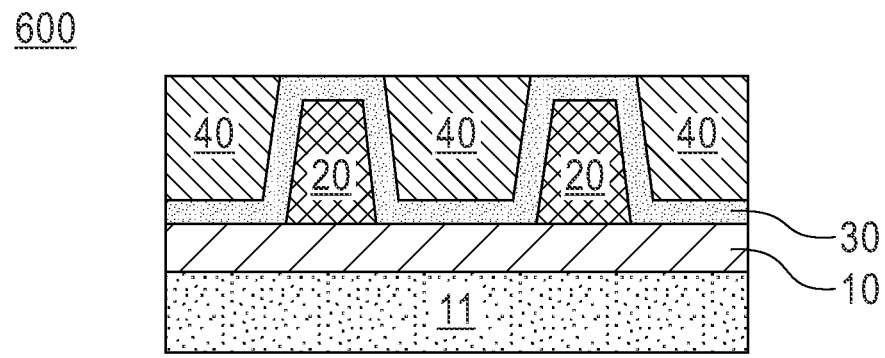
FIG. 6 depicts a cross-sectional view of the semiconductor structure after a chemical mechanical polish (CMP) in accordance with an embodiment of the present invention.

FIG. 6 depicts a cross-sectional view of semiconductor structure 600 after a CMP in accordance with an embodiment of the present invention. The CMP removes excess metal 40 above dielectric material 30 using the top surface of dielectric material 30 as a CMP stop. After the CMP, the top surface of semiconductor structure 600 is flat and the top surface of metal 40 is level with the top surface of dielectric material 30 that is above the remaining portions of metal 20. As depicted, a height of metal 40 can be determined by a height of power and ground lines formed by metal 20 and a thickness of dielectric material 30.

Figure 7:
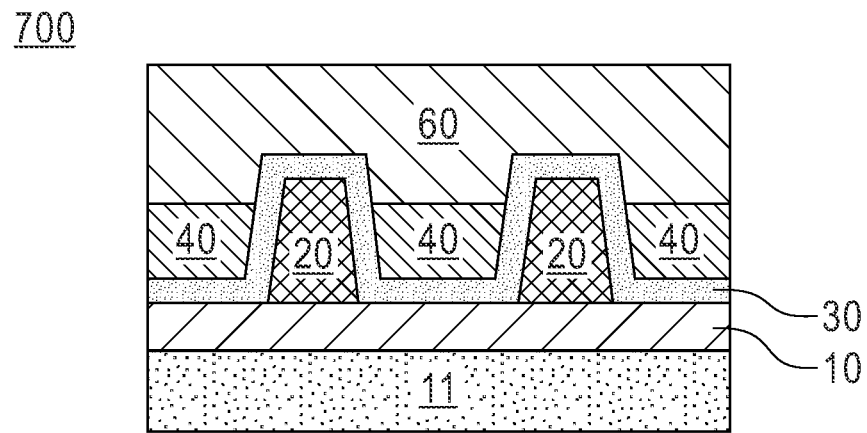
FIG. 7 depicts a cross-sectional view of the semiconductor structure after recessing the metal layer and depositing an interlevel dielectric material over the semiconductor structure in accordance with an embodiment of the present invention.

FIG. 7 depicts a cross-sectional view of semiconductor structure 700 after recessing metal 40 and depositing ILD 60 over the exposed top surfaces of dielectric material 30 and the remaining portion of metal 40 in accordance with an embodiment of the present invention. Recessing metal 40 is an optional step and may be performed or not performed depending, at least in part, on the desired electrical performance attributes of the semiconductor chip and/or semiconductor device manufacturing process limitations and yields.

As depicted, FIG. 7 includes the elements of FIG. 6 but with a reduced height of metal 40. The height of metal 40 between dielectric material 30 on metal 20 may be the same as the top surface of dielectric material 30 when the optional recessing of metal 40 does not occur or the height of metal 40 may be less than the height of metal 20. For example, depending on the desired metal density of metal 40 forming the floating metal in the completed semiconductor chip, the height of the remaining metal 40 can be varied. For example, the amount of capacitance can be controlled, at least in part, by the amount of metal 40 remaining after recessing. Increasing the amount of the remaining metal 40 forming the floating metal can increase the capacitance and the capacitance density of the backside power delivery network. Additionally, the amount of metal 40 remaining after recessing can be controlled to provide a desired thermal conductivity of the backside metal layers of the completed semiconductor chip.

An RIE can be used to recess metal 40. The depth of the recess or the amount of metal 40 removed can be varied and may be adjusted according to the desired metal density in the first backside metal layer (e.g., adjusted for optimal electrical and thermal chip performance). For example, the recess of metal 40 can expose about one-half of the height or sidewall of dielectric material 30 on metal 20. Semiconductor structure 700 can be formed using subtractive processes on wafer substrate 10, metal 20, and metal 40.

Figure 8:
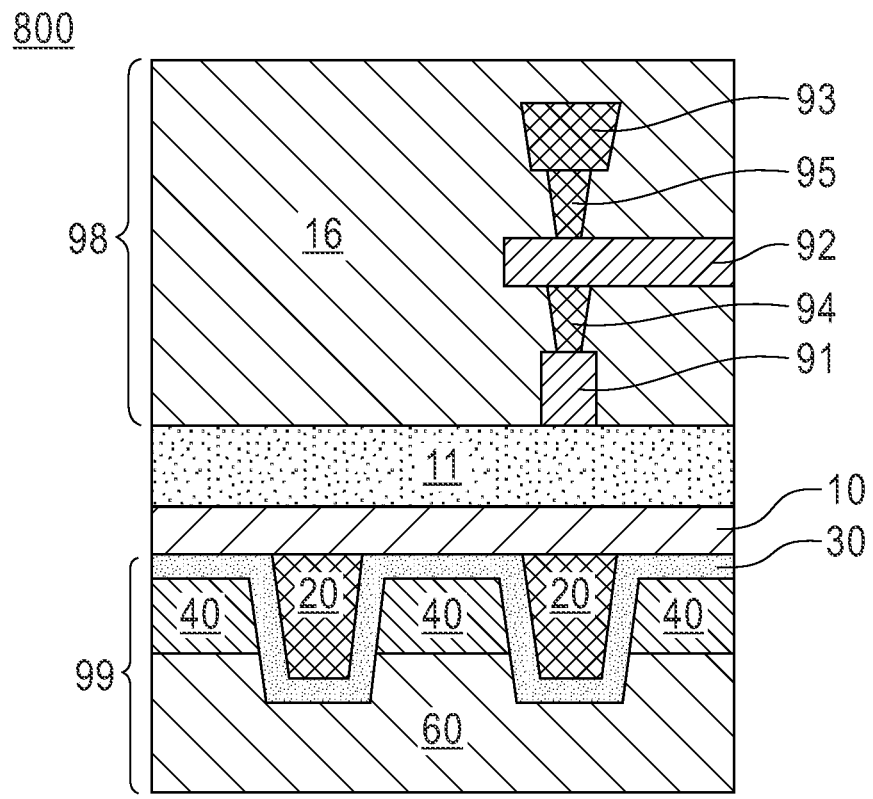
FIG. 8 depicts a cross-sectional view of the semiconductor structure with front side metal layers and the first backside metal layer forming the power distribution structures and the floating metal for increased capacitance in accordance with an embodiment.

FIG. 8 depicts a cross-sectional view of semiconductor structure 800 with BEOL interconnect layers 98 and the first backside metal layer 99 forming the power distribution structures with metal 20 and a part of three floating metal portions from metal 40 for increased capacitance in accordance with an embodiment. FIG. 8 includes device region 11 and BEOL interconnect layers 98 above wafer substrate 10 and backside metal layer 99 with metal 20 and metal 40 below wafer substrate 10. As depicted, FIG. 8 includes ILD 60, dielectric material 30 around metal 20 and on portions of wafer substrate 10, metal 40 surrounded by dielectric material 30 and above ILD 60, device region 11 above wafer substrate 10, signals 91, 92, and 93, vias 94 and 95 in ILD 16 of BEOL interconnect layers 98. FIG. 8 depicts semiconductor structure 800 formed using subtractive metallization processes.

Metal 20 and metal 40 in backside metal layer 99 are formed by subtractive processes. Each portion of metal 20 can be one of a power line or a ground line. As previously discussed, the distribution of power lines and ground lines in backside metal layer 99 can be semiconductor chip design dependent. For example, the leftmost metal 20 can be a power line that is adjacent to metal 20 which is a ground line.

As known to one skilled in the art, while BEOL interconnect layers 98 depicts only lines 91, 92, 93 and vias 4 and 5, BEOL interconnect layers 98 may also include other lines, vias, and contacts and additional metal layers (e.g., M4, M5, M10, etc.) above line 93 in M3 of BEOL interconnect layers 98. While not depicted in FIG. 8, in various embodiments, TSVs connect the power and ground lines 20 to one or more of BEOL interconnect layers 98 or a buried power rail (not depicted). As known to one skilled in the art, while not depicted in FIG. 8, one or more additional backside metal layers that were deposited, patterned, and etched to form more portions of the floating metal layer and power lines can be present in FIG. 8 along with vias connecting the metal layers and layers of ILD 60 separating the metal layers.

Figure 9:
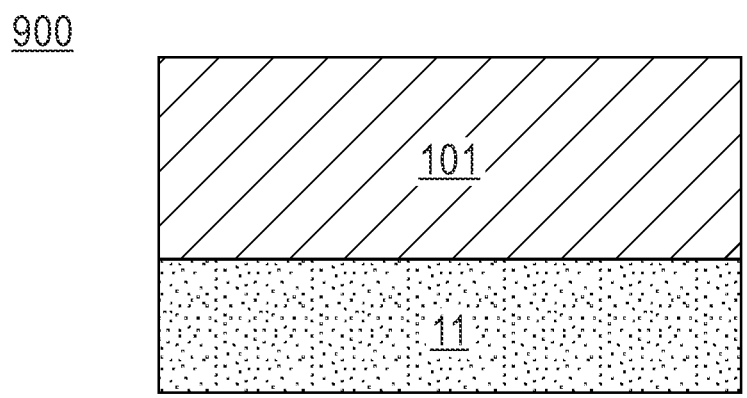
FIG. 9 depicts a cross-sectional view of a semiconductor structure after wafer thinning of a wafer substrate in accordance with an embodiment of the present invention.

FIG. 9 depicts a cross-sectional view of semiconductor structure 900 with wafer substrate 101 in accordance with an embodiment of the present invention. As depicted, FIG. 9 includes wafer substrate 101 after backside grind and device region 11 on the front side or device side of wafer substrate 101. Device region 11 is essentially the same as device region 11 in FIG. 1. Not depicted in FIG. 9 are the BEOL metal layers residing on the front side of wafer substrate 10 above device region 11. The BEOL metal layers are depicted in BEOL interconnect layers 98 on FIG. 1. In various embodiments, wafer substrate is a thinned wafer substrate 101. Wafer substrate 101 can be similar to or essentially the same as wafer substrate 10 depicted in FIG. 1.

Figure 10:
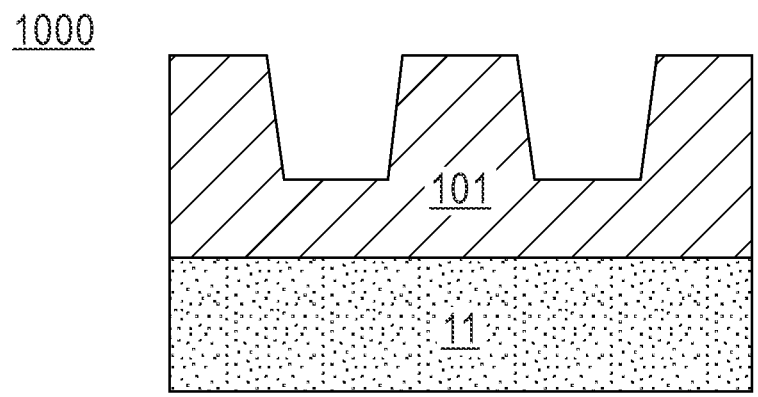
FIG. 10 depicts a cross-sectional view of the semiconductor structure after etching the wafer substrate in accordance with an embodiment of the present invention.

FIG. 10 depicts a cross-sectional view of semiconductor structure 1000 after etching wafer substrate 101 in accordance with an embodiment of the present invention. FIGS. 10-16 depict a method of forming portions of the floating metal layer on the backside of wafer substrate 101 using damascene metallization processes.

Using known photolithography and semiconductor wafer etch processes, such as RIE or an ion beam etch (IBE), portions of wafer substrate 101 are selectively removed to form backside power structures (e.g., lines and planes). The amount or portions of wafer substrate 101 removed can determine, at least in part, the size and shape of the power and ground lines formed in the first backside metal layer in later process steps. Additionally, the spacing of the removed portions of wafer substrate 101 can determine the pitch of the power and ground lines formed in later processing steps. The size, spacing, and shape of the removed portions of wafer substrate 101 may be controlled to provide desired capacitance and thermal performance attributes of the first backside metal layer in the completed semiconductor chip. In other words, the amount of wafer substrate 101 removed by the RIE can control at least a portion of the electrical and thermal performance provided by the first backside metal layer when the processing of the semiconductor chip is completed.

Figure 11:
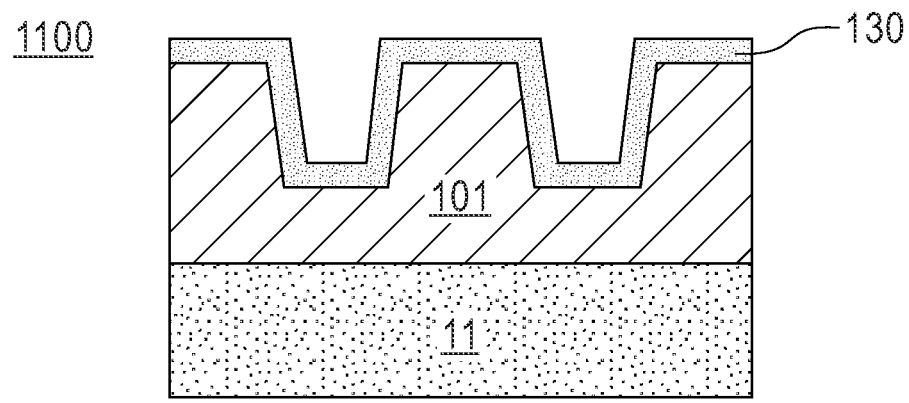
FIG. 11 depicts a cross-sectional view of the semiconductor structure after depositing a dielectric material over the wafer substrate in accordance with an embodiment of the present invention.

FIG. 11 depicts a cross-sectional view of semiconductor structure 1100 after depositing dielectric material 130 over wafer substrate 101 in accordance with an embodiment of the present invention. As depicted, FIG. 11 includes device region 11 under wafer substrate 101 and dielectric material 130. Dielectric material 130 can be deposited using one of PECVD, PVD, CVD, or ALD, for example, over the top surface of wafer substrate 101 and inside the recesses or trenches formed by the etch of wafer substrate 101. In one embodiment, a spin-on-dielectric material or a spin-on-glass (SOG) is deposited on wafer substrate 101. Dielectric material 130 conformally coats the surfaces of wafer substrate 101.

Dielectric material 130 may be any dielectric material used in semiconductor manufacture. In various embodiments, dielectric material 130 is a high k dielectric material selected to improve the capacitance of the completed power delivery network. For example, dielectric material 130 can be but is not limited to one of a hafnium oxide material, a zinc oxide material, an aluminum nitride material, or aluminum oxide material. The thickness of dielectric material 130 can be controlled and may vary (e.g., from 7 nm to 500 nm) depending on the desired electrical requirements or capacitance of the completed semiconductor chip. As previously discussed, using a high k dielectric material for dielectric material 130 rather than a low k dielectric material between the floating metal and the power and ground lines can provide increased capacitance as compared to using a low k dielectric material with the same semiconductor chip design.

Figure 12:
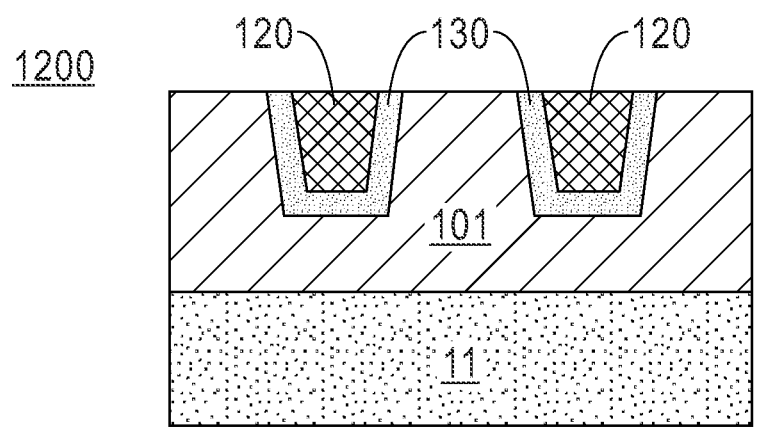
FIG. 12 depicts a top view of the semiconductor structure after depositing a first metal material and performing a CMP to remove excess portions of the first metal material from the top surface of the wafer substrate in accordance with an embodiment of the present invention.

FIG. 12 depicts a cross-sectional view of semiconductor structure 1200 after depositing metal material 120 and performing a CMP to remove excess dielectric material 130 and excess metal material 120 from the unetched top surface of wafer substrate 101 in accordance with an embodiment of the present invention. As depicted, FIG. 12 includes the elements of FIG. 11 and metal material 120. Metal material 120 can be a metal similar to the metal materials used for metal 20 in FIG. 2 with the addition of copper. Copper is not used in FIG. 2 of the previous embodiment because of the difficulty of using subtractive etch processes on copper in semiconductor manufacture. Therefore, metal material 120 can be but is not limited to copper, cobalt, ruthenium, tungsten, molybdenum, or similar metal or metal alloy used in semiconductor power structures. Metal material 120 may be deposited with known semiconductor metal deposition processes, such as but not limited to PVD, CVD, or ALD. Metal material 120 can be deposited over dielectric material 130 and fills the recess in wafer substrate 101 and extends above the surface of dielectric material 130.

After metal material 120 deposition, a CMP can be performed removing excess dielectric material 130 and metal material 120 above the raised or unetched top surface of wafer substrate 101. In various embodiments, the CMP uses the unetched top surface of wafer substrate 101 as a CMP stop. In this case, the top surfaces of wafer substrate 101, dielectric material 130, and metal material 120 are all level (e.g., the top surface of semiconductor structure 900 is flat). As previously stated, wafer substrate 10 is a flipped wafer for processing, and what are typically known as the backside layers (e.g., metal material 120 and dielectric material 130) of wafer substrate 10 are depicted as on top of wafer substrate 10. In other words, the top surface of wafer substrate 10 when wafer substrate 10 is not flipped would be the bottom surface of wafer substrate 10.

In some embodiments, the CMP removes a portion of the unetched top surface of wafer substrate 10. In this embodiment, the CMP determines, at least in part, the height of the portions of the floating metal (i.e., metal 140) in semiconductor structure 1400 depicted later in FIG. 14.

Figure 13:
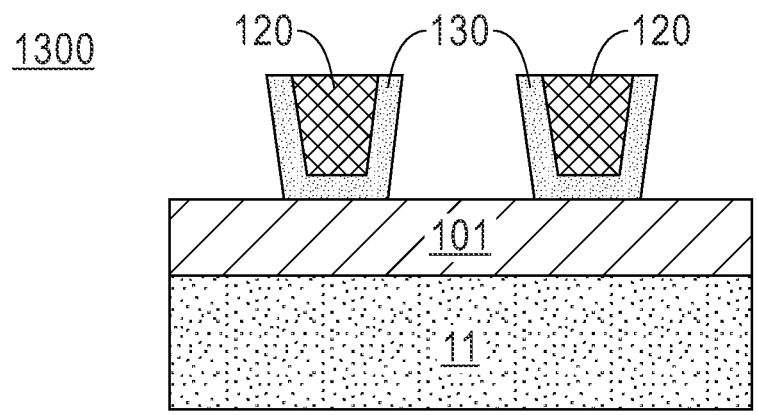
FIG. 13 depicts a cross-sectional view of the semiconductor structure after etching a portion of the wafer substrate not under the remaining dielectric material in accordance with an embodiment of the present invention.

FIG. 13 depicts a cross-sectional view of semiconductor structure 1300 after etching a portion of wafer substrate 101 that is not under the remaining dielectric material 130 in accordance with an embodiment of the present invention. As depicted, FIG. 13 includes the elements of FIG. 12 but, with a reduced amount of wafer substrate 101. For example, using a combination of a dry etch, such as an RIE and a wet etch, the exposed top portion of wafer substrate 101 can be removed to a level that is equal to or just above the bottom surface of dielectric material 130. The RIE etch may leave portions of wafer substrate 101 around the concave or lower portions of dielectric material 130 that can be removed by the wet etch process. After completing the etch processes, the sides of dielectric material 130 or almost all of the outer sides of dielectric material 130 can be exposed. As depicted in FIG. 13, wafer substrate 101 remains below the bottom portion of dielectric material 130. In an embodiment, a small portion of the top surface of wafer substrate 101 is above the bottom portion of dielectric material 130.

Figure 14:
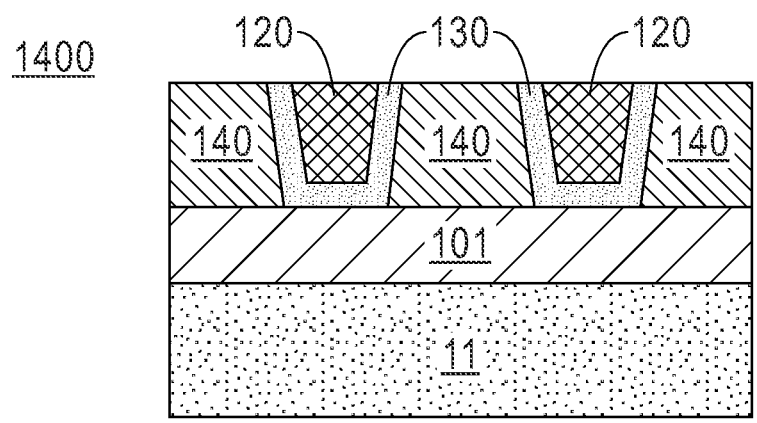
FIG. 14 depicts a cross-sectional view of the semiconductor structure after depositing a second metal material over exposed portions of the wafer substrate, the dielectric material, and the first metal material and performing a CMP in accordance with another embodiment of the present invention.

FIG. 14 depicts a cross-sectional view of semiconductor structure 1400 after depositing metal 140 above exposed portions of wafer substrate 101 and performing a CMP in accordance with another embodiment of the present invention. As depicted, FIG. 14 includes the elements of FIG. 13 and metal 140. In various embodiments, metal 140 fills the cavity between adjacent sides of dielectric material 130 and extends over the top surface of the remaining metal material 120. Metal 140 can be one of cobalt, ruthenium, molybdenum, or tungsten, but is not limited to these metals or alloys of these metals. Metal 140 can be deposited over exposed surfaces of wafer substrate 101, dielectric material 130, and metal material 120 using known deposition processes, such as but not limited to CVD, PVD, or ALD. The combination of metal material 120 and metal 140 forms a first backside metal layer.

After the deposition of metal 140, a CMP can be performed to remove excess metal 140. The CMP can leave a flat surface of semiconductor structure 1400 where the top surfaces of metal 140, metal material 120, and exposed portions of dielectric material 130 are level. In various embodiments, the CMP stops at the top surfaces of metal material 120. In an embodiment, a top portion of metal material 120 and associated top portions of dielectric material 130 and metal 140 are removed. In one embodiment, the deposition of metal 140 fills a portion of the area or trench between adjacent sides of dielectric material 130 (e.g., only the bottom 50% of the sides of dielectric material 130 are covered by metal 140). In this case, the CMP does not occur and the optional recessing of metal 140 is not required.

Metal 140 remaining around the sides of dielectric material 130 and above the exposed surfaces of wafer substrate 101 can form a floating metal abutting dielectric material 130 and between power and ground lines formed by the remaining portions of metal material 120. The portions of the floating metal layer created by metal 140 increase the capacitance of the backside power structures. Increasing the size or the density of the remaining portions of metal 140 forming floating metal increases the capacitance. Metal 140 forming the floating metal provides decoupling capacitance to stabilize the current flow. As previously discussed, increasing the capacitance for backside power delivery networks is desirable. Additionally, creating the portions of metal 140 can increase backside metal density to aid in dissipating the thermal energy generated by semiconductor devices in device region 11 of the semiconductor chip.

Using damascene metallization processes to etch wafer substrate 101, deposit dielectric material 130, deposit and form power and ground lines from metal material 120, and deposit and form portions of floating metal from metal 140 as discussed with respect to FIGS. 9-14 allows, at least in part, the control or tuning of the capacitance of the final semiconductor chip by controlling the geometries and the materials used to form the portions of the floating metal formed from metal 140 between the power and ground lines in metal material 120. Even without explicit ground connections, metal 140 (e.g., the floating metal) can provide increased capacitance. Additionally, the amount of metal 140 and the density of metal 140 remaining after CMP can be controlled to provide a desired thermal conductivity for the remaining backside metal.

Figure 15:
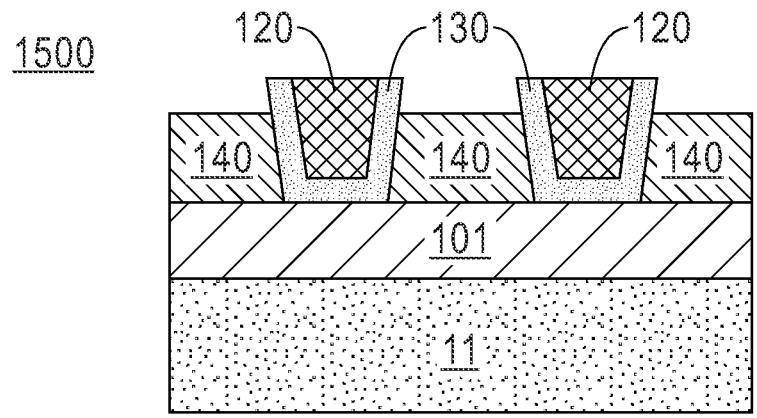
FIG. 15 depicts a cross-sectional view of the semiconductor structure after recessing the second metal material in accordance with an embodiment of the present invention.

FIG. 15 depicts a cross-sectional view of semiconductor structure 1500 after recessing metal 140 in accordance with an embodiment of the present invention. As depicted, FIG. 15 includes the elements of FIG. 14 but with a reduced amount of metal 140. The step of recessing metal 140 is optional. The recessing of metal 140 can occur to obtain a desired metal density in the first backside metal layer to achieve desired capacitance and thermal conductivity from the first backside metal layer in the completed semiconductor chip. In various embodiments, by controlling the remaining portion of metal 140 (i.e., the floating metal) a chip designer provides the desired balance between capacitance and metal density for both electrical and thermal chip requirements.

The recessing of metal 140 after the CMP can occur using one or more known wet etch processes. The specific wet etch process can be selected according to the metal material in metal 140. The depth of the recessing of metal 140 can be varied by controlling known wet parameters, such as etch time, chemistry, and temperature. The recessing of metal 140 can be a small recess (e.g., approximately 10% of the height of metal 140) or a more significant recess of metal 140 (e.g., 60% of the height of metal 140), but is not limited to these amounts of recessing of metal 140. As previously discussed, the amount of recessing determining a height of metal 140 abutting dielectric material 130 that is between the power and ground structures or lines formed by metal material 120 can control or tune the capacitance and thermal conductivity provided by the remaining portions of metal 140.

FIG. 16 depicts a cross-sectional view of semiconductor structure 1600 after depositing ILD 160 in accordance with an embodiment of the present invention. As depicted, FIG. 16 includes the elements of FIG. 15 and ILD 160. ILD 160 is deposited over semiconductor structure 1600 covering exposed surfaces of metal 140, dielectric material 130, and metal material 120. ILD 160 can be any known interlevel dielectric material used in semiconductor manufacture. For example, ILD 160 may be $SiO_2$. In FIG. 16, the portion of metal 140 contacting wafer substrate 101 is larger than the portion of metal 140 contacting ILD 160. In various embodiments, metal 140 forms a floating metal that is separated from the power and ground lines in metal material 120 by dielectric material 130.

As known to one skilled in the art, a second backside metal layer can be deposited over ILD 160. Repeating the process steps discussed with respect to FIGS. 9-16 where the etch of wafer substrate 10 occurs as an etch of ILD 160, the second metal layer (not depicted) on ILD 160 can be personalized to form another layer of power and ground lines in metal material 120 surrounded by a layer of dielectric material 130. Another layer of metal 140 forms the floating metal between dielectric material 130 on the power and ground lines in metal material 120. Vias (not depicted) can connect power and ground lines 120 in the first backside metal layer to power and ground lines 120 in the second backside metal layer (not depicted). In some cases, the second metal layer can be a power plane, such as power plane 22 depicted in FIG. 1. Using the processes discussed above with reference to FIGS. 9-16, any number of backside metal layers can be formed into one or more layers of floating metal (e.g., metal 140) that is separated from the power and ground lines (e.g., metal material 120) by dielectric material 130.

Figure 17:
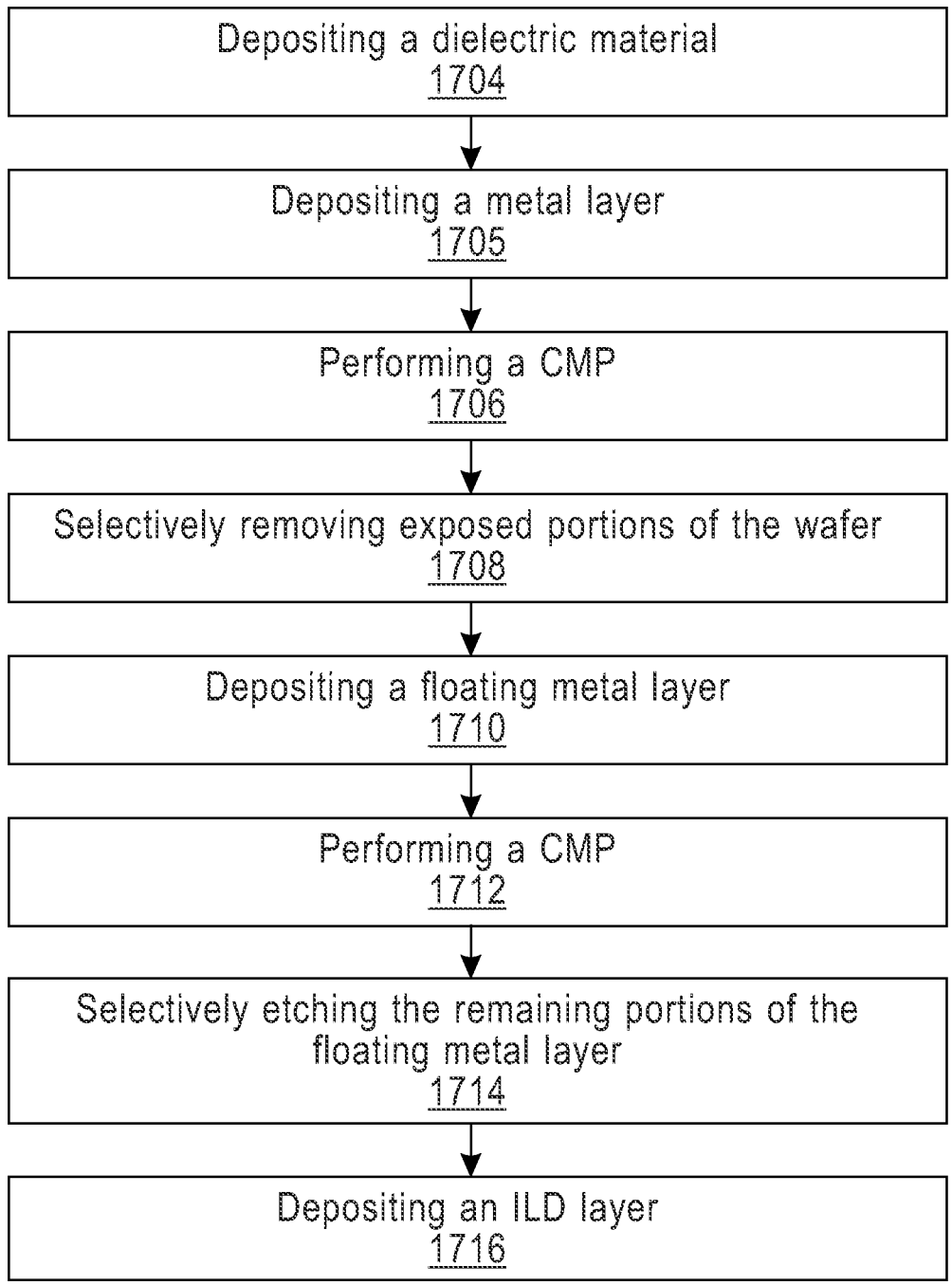
FIG. 17 is a flow chart depicting the steps of a damascene metallization process to form one or more backside metal layers on a wafer in accordance with an embodiment of the present invention.

FIG. 17 is a flow chart depicting the steps of a damascene metallization process to form one or more backside metal layers on a wafer in accordance with an embodiment of the present invention. The wafer is flipped for damascene processing steps below so that the top surface of the flipped wafer is a bottom surface of the wafer when it is not flipped (e.g., when the devices the front side of the wafer are up). The formed backside power distribution network provides power to one or more front side metal layers on the wafer using one or more TSVs. The TSVs connect one or more power and ground lines and/or a backside power plane to front side buried power rail or one or more of the BEOL interconnect layers in the front side of the wafer.

In step 1702, the method includes selectively etching portions of the backside of a wafer. As previously in detail with reference to FIG. 10, the backside of the wafer is patterned and etched using known semiconductor wafer etch processes.

In step 1704, the method includes depositing a dielectric material. In various embodiments, a high k dielectric material is deposited over the wafer as previously in detail with reference to FIG. 11.

In step 1705, the method includes depositing a first metal layer over the dielectric material as discussed in detail with respect to FIG. 12. The deposited first metal layer fills the recesses or trenches created during the selective etch of the wafer in step 1702 and covers the dielectric material.

In step 1706, the method includes performing a CMP to remove the excess first metal layer above the unetched portions of the wafer and the dielectric material on the unetched portions of the wafer. The portions of the first metal material layer remaining after the CMP forms power and ground lines above the dielectric material on the wafer.

In some embodiments, the height of the unetched portions of the remaining after CMP determines, at least in part, a height of floating metal formed in later steps (i.e., in step 1712). The CMP is discussed in detail with reference to FIG. 12.

In step 1708, the method includes selectively removing portions of the wafer not contacting the dielectric material. The exposed portions of the wafer not directly contacting the dielectric material can be removed by using a known combination of a dry etch process (e.g., RIE) and one or more wet etch processes. As previously in detail with reference to FIG. 13, the exposed portions of the wafer are selectively removed until the top surface of the exposed wafer that is etched with the combination of etching processes is approximately level with the lowest bottom surface of the dielectric material (i.e., the bottom of the dielectric material deposited in the trenches in the wafer formed in step 1702).

In step 1710, the method includes depositing a floating metal layer over the semiconductor structure. As previously in detail with reference to FIG. 14, the layer of the floating metal (i.e., metal 140) is deposited on exposed surfaces of the wafer, the remaining dielectric material, and the remaining portions of the first metal layer.

In step 1712, the method includes performing a CMP to remove the excess portions of the floating metal. The floating metal is removed above the portions of the first metal layer and a part or portions of the floating metal that are directly above one or more portions of the wafer not under the dielectric material as discussed previously in detail with respect to FIG. 14. The portions of the floating metal remaining (e.g., the height, the length, and the spacing of each remaining portion) determine, at least in part, a capacitance of the first backside metal layer on the wafer.

In step 1714, the method includes an optional step to recess the remaining portions of the floating metal as previously discussed in detail with respect to FIG. 15.

In step 1716, the method includes depositing a layer of ILD over the semiconductor structure (e.g., over exposed portions of the floating metal, the dielectric material, and the first metal layer) as previously discussed with respect to FIG. 16. In various embodiment, vias can be formed in the ILD and one or more additional metal layers can be formed. As known to one skilled in the art, using the above process steps with small modifications, the additional metal layer can be deposited and processed to form portions of the floating metal in a second, a third, or a fourth metal layer on the wafer. These additional metal layers will also be a part of the backside power distribution network on the wafer.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor structure, the semiconductor structure comprising:
a plurality of portions of a floating metal layer separated by a dielectric material from one or more power and ground lines in one or more backside metal layers on a semiconductor wafer, wherein a height of the plurality of portions of the floating metal layer is less than the height of the one or more power and ground lines.

2. The semiconductor structure of claim 1, wherein a height of each of the plurality of portions of the floating metal layer in the one or more backside metal layers is variable.

3. The semiconductor structure of claim 1, wherein the height of the plurality of portions of the floating metal layer in the one or more backside metal layers controls, at least in part, a capacitance of the one or more backside metal layers in a backside power delivery network.

4. The semiconductor structure of claim 1, wherein the plurality of power and ground lines and the plurality of portions of the floating metal layer have a trapezoidal shape.

5. The semiconductor structure of claim 1, wherein a capacitance density of the one or more metal layers in the one or more backside metal layers correlates to one or more of a height of the plurality of portions of the floating metal layer and a distance between adjacent portions of the plurality of portions of the floating metal layer.

6. The semiconductor structure of claim 1, wherein a density of the plurality of portions of the floating metal layer in the one or more backside metal layers affects a thermal conductance of each of the one or more metal layers.

7. The semiconductor structure of claim 1, wherein the one or more backside metal layers provide power to at least one front side metal layer on the semiconductor wafer.

8. The semiconductor structure of claim 1, wherein the dielectric material is a high k dielectric material.

9. The semiconductor structure of claim 8, wherein a capacitance of each of the one or more backside metal layers correlates to the dielectric material and a thickness of the dielectric material.

10. The semiconductor structure of claim 1, wherein the plurality of portions of a floating metal layer in a first metal layer of the one or more backside metal layers resides on a backside of the semiconductor wafer.

11. The semiconductor structure of claim 10, wherein the first metal layer of the one or more backside metal layers connects to a second metal layer the one or more backside metal layers through one or more vias.

12. The semiconductor structure of claim 10, wherein a top surface of the plurality of portions of the floating metal is above a top surface of the plurality of power and ground lines.

13. A semiconductor structure, the semiconductor structure comprising:
one or more backside metal layers providing a power distribution network to one or more front side metal layers of a semiconductor wafer, wherein the one or more backside metal layers include:
a plurality of power and ground lines contacting portions of a backside of the semiconductor wafer with the one or more front side metal layers;
a layer of a dielectric material over the plurality of power and ground lines and on one or more portions of the backside of the semiconductor wafer between each of the plurality of power and ground lines; and
a plurality of portions of a floating metal layer over one or more portions of the layer of the dielectric material between each of the plurality of power and ground lines.

14. The semiconductor structure of claim 13, wherein the one or more backside metal layers further comprises:
a bottom surface of the plurality of portions of the floating metal layer is on the dielectric material; and
a layer of an interlevel dielectric material is over the bottom surface of the plurality of portions of the floating metal and exposed portions of the bottom surface of the dielectric material.

15. The semiconductor structure of claim 13, wherein the one or more backside metal layers comprises:
a bottom surface of the plurality of portions of the floating metal layer is above a bottom surface of the plurality of power and ground lines.

16. The semiconductor structure of claim 15, wherein a height of the bottom surface of the plurality of portions of the floating metal layer above the bottom surface of the plurality of power and ground lines correlates to a capacitance of each metal layer of the one or more backside metal layers with the plurality of portions of the floating metal layer.

17. The semiconductor structure of claim 13, wherein a top surface of the plurality of power and ground lines is above a top surface of the plurality of portions of the floating metal.

18. The semiconductor structure of claim 13, wherein the plurality of power and ground lines and the plurality of portions of the floating metal layer have a trapezoidal shape.

19. A semiconductor structure with a plurality of portions of a floating metal layer on a backside of a semiconductor wafer with one or more semiconductor devices on a front side of the semiconductor wafer, the semiconductor structure comprising:
a plurality of portions of a floating metal layer on portions of a backside of a semiconductor wafer;
a dielectric material on portions of the backside of the semiconductor wafer adjacent to the plurality of portions of the floating metal layer and on sides of the plurality of portions of the floating metal layer;
a plurality of power and ground lines inside the dielectric material, wherein a top surface of each of the plurality of power and ground lines and the dielectric material are not level with a top surface of the plurality of portions of the floating metal layer; and
an interlevel dielectric material over the top surface of each of the plurality of power and ground lines, the dielectric material, and the plurality of portions of the floating metal layer.

20. The semiconductor structure of claim 19, wherein the top surface of the plurality of portions of the floating metal is below the top surface of the plurality of power and ground lines.

21. The semiconductor structure of claim 19, wherein the top surface of the plurality of portions of the floating metal is sixty percent of a height of the plurality of power and ground lines.

22. The semiconductor structure of claim 19, wherein the plurality of power and ground lines and the plurality of portions of the floating metal layer have a trapezoidal shape.

* * * * *